United States Patent [19]

Watanabe

[11] Patent Number: 4,489,124

[45] Date of Patent: Dec. 18, 1984

[54] PROCESS FOR FORMING THIN FILM, HEAT TREATMENT PROCESS OF THIN FILM SHEET, AND HEAT TREATMENT APPARATUS THEREFOR

[76] Inventor: Seizo Watanabe, 353-10, Kaminibukata-machi, Hachioji-shi, Tokyo, Japan

[21] Appl. No.: 363,441

[22] Filed: Mar. 30, 1982

[30] Foreign Application Priority Data

Apr. 6, 1981 [JP] Japan .................................. 56-51547
Apr. 6, 1981 [JP] Japan .................................. 56-51548
Apr. 6, 1981 [JP] Japan .................................. 56-51549

[51] Int. Cl.$^3$ .............................................. B05D 5/12
[52] U.S. Cl. .................. 428/220; 204/192 R; 204/192 N; 427/130; 427/132; 427/129; 427/172; 427/177; 427/250; 427/289; 427/383.1; 427/397.7; 264/342 R
[58] Field of Search ............... 427/172, 289, 177, 129, 427/130, 132, 250, 383.1, 397.7, 248.1; 204/192 R, 192 N; 360/134; 428/900, 220; 264/342 R

[56] References Cited

U.S. PATENT DOCUMENTS

| | | | |
|---|---|---|---|
| 2,748,015 | 5/1956 | Speed et al. | 427/172 |
| 2,748,016 | 5/1956 | Speed et al. | 427/172 |
| 3,900,604 | 8/1975 | Tanabe et al. | 427/172 |
| 3,915,779 | 10/1975 | Yoshikawa et al. | 427/172 |
| 4,132,552 | 1/1979 | Van Paesschen | 427/172 |
| 4,239,835 | 12/1980 | Iijiwa et al. | 427/132 |
| 4,367,257 | 1/1983 | Arai et al. | 427/132 |

Primary Examiner—Norman Morgenstern
Assistant Examiner—Janyce A. Bell

[57] ABSTRACT

The invention provides a process for forming a magnetic thin film on a base film, a heat treatment process of a thin film sheet consisting of the base film and the magnetic thin film, and an apparatus for performing heat treatment of the thin film sheet. Tension applied to the thin film sheet is substantially equal to that applied to the base film when the magnetic thin film is formed thereon. Then, the thin film sheet is treated with heat. The thin film sheet is heated with a given temperature gradient to a reactive temperature at which heat shrinkage occurs, while the tension is being applied thereto. Thereafter, the thin film sheet to which the tension is still applied is cooled with substantially the same temperature gradient as applied in heating. The heat treatment apparatus has a film driving unit including a supply reel, a take-up reel, a drive source and guide rollers; a heating unit including heating plates, heater blocks and a temperature controller for heating the sheet to the reactive temperature; and a heat insulating unit including a thermostat and another temperature controller for maintaining the sheet at the nonreactive temperature which is slightly lower than the reactive temperature.

11 Claims, 11 Drawing Figures

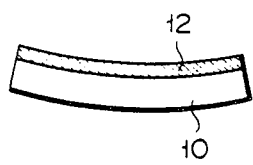
FIG. 1A
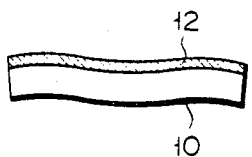
FIG. 1B
FIG. 3
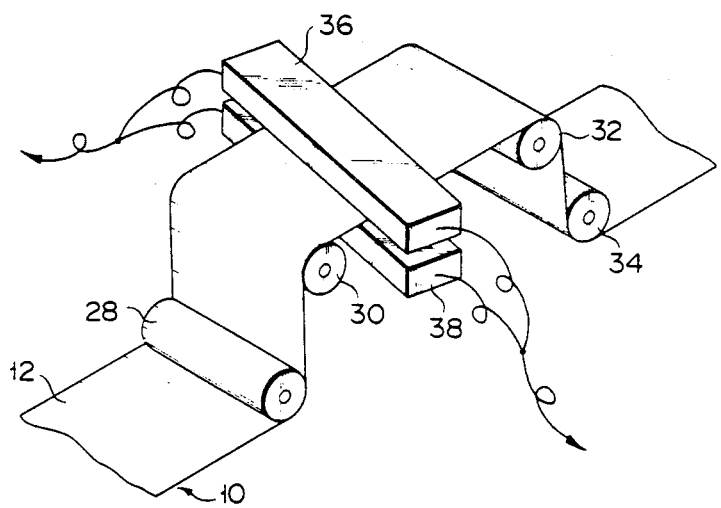
FIG. 4
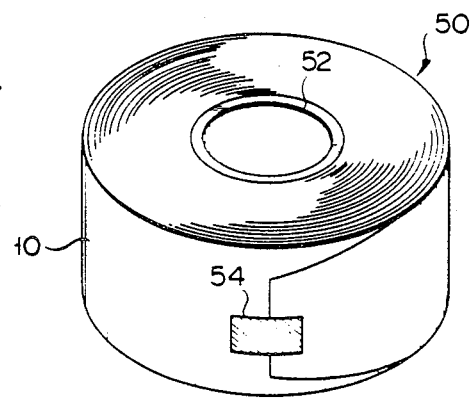

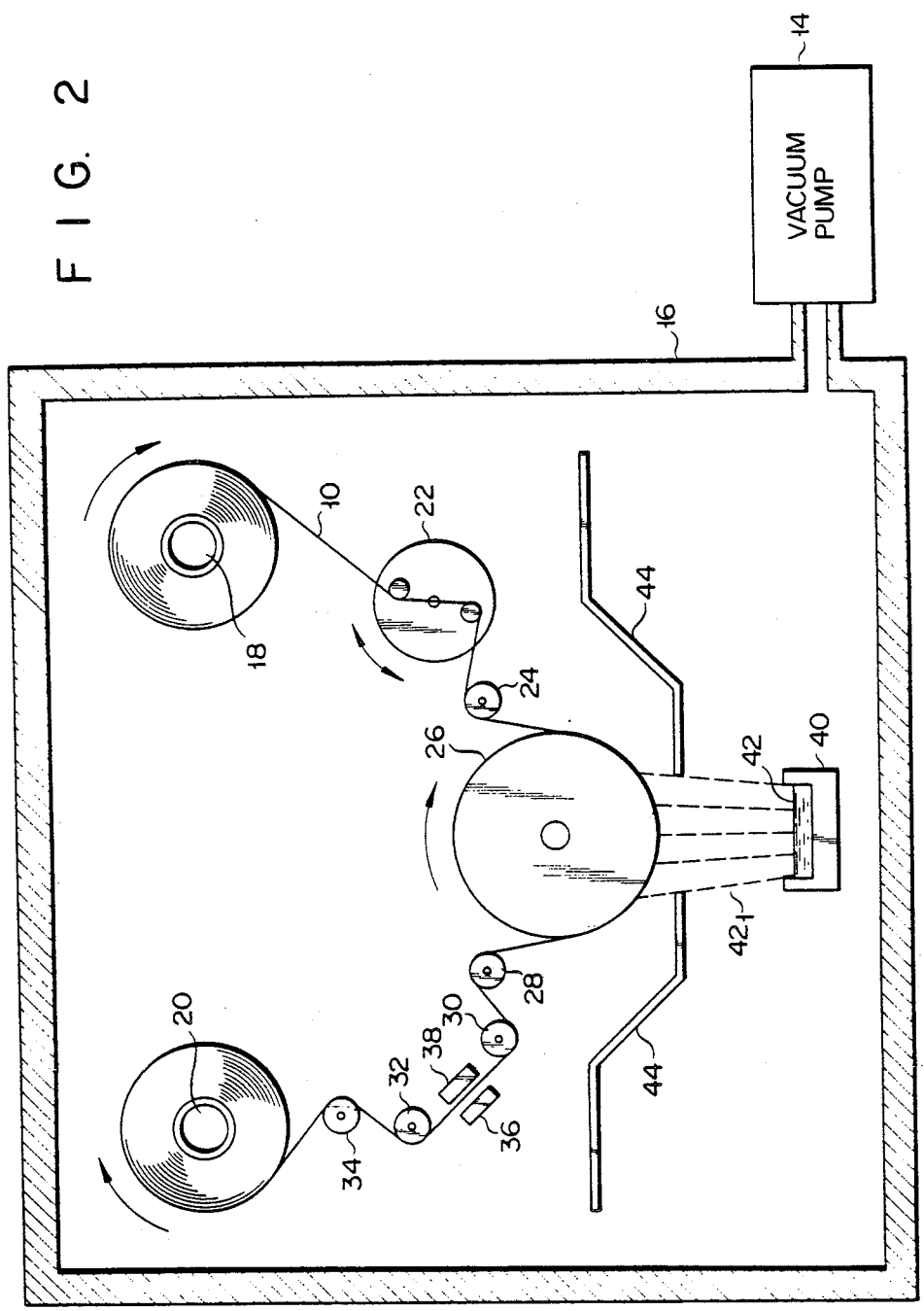

PROCESS FOR FORMING THIN FILM, HEAT TREATMENT PROCESS OF THIN FILM SHEET, AND HEAT TREATMENT APPARATUS THEREFOR

BACKGROUND OF THE INVENTION

The present invention relates to a process for forming a magnetic thin film on a thin plastic base film such as a polyester film, a heat treatment process of a sheet of the base film and the magnetic thin film, and an apparatus for performing heat treatment therefor.

A magnetic tape of a metal thin film type has received great attention as a high density recording medium. Various processes for fabricating the magnetic tape of the metal thin film type have been proposed. Among these processes, typical examples are vacuum deposition, electron beam deposition, sputtering, and ion-plating. A magnetic tape which is fabricated by one of these processes has an extremely thin magnetic layer as compared with a conventional magnetic tape on which magnetic particles together with a binder are coated on a base film. The thinner the magnetic layer is, the better the high frequency response is in recording and playback. For this reason, when the magnetic thin film is used, a magnetic recording tape which is suitable for high density recording is obtained.

The base film which is used in a metal thin film type magnetic recording tape for long time recording is extremely thin. Assuming that this thin film magnetic recording tape is fabricated by vacuum deposition, the base film is thermally damaged by radiant heat from a vapor source and latent heat of vaporized metal atoms. Then, wrinkles are formed on the film. Further, while the vaporized metal atoms are recrystalized and formed as a thin film, internal stress corresponding to heat shrinkage of the thin film occurs. A base film 10 is curled with a thin film layer 12 facing inward due to inner stress, as shown in FIG. 1A. When a magnetic recording tape on which a large wrinkle is formed is used, dropout occurs. Further, when a curled magnetic recording tape is used, it vertically deviates from the normal tape driving path (i.e., it meanders). Thus, the tape is misaligned with the head and the tape is irregularly wound around a take-up reel.

In general, a thin film magnetic recording tape is fabricated as follows. A magnetic material is deposited on a base film strip of a wide width. Various coatings and surface treatments are performed. A thin film sheet of a great width is cut into narrow bands of a predetermined width. Thus, the magnetic tape is fabricated. The width of the thin film sheet on which the magnetic particles are deposited is considerably greater than the magnetic recording tape as the final product. In order to completely eliminate wrinkles and curls from the thin film magnetic recording tape, the thin film sheet must be completely smoothed before it is cut into narrow bands.

For this purpose, the base film on which the thin film is formed may be heated. However, when the base film with the thin film thereon as shown in FIG. 1A is simply heated, the curled film 10 becomes corrugated, as shown in FIG. 1B. Therefore, with a simple heat treatment as described above, the wrinkles and curl cannot be uniformly eliminated from the entire surface of the film 10.

As the prior art which is proposed to eliminate the wrinkles and the curls, Japanese Patent Disclosure Nos. 53-83706 and 53-104204 disclose measures for this purpose. In these patent disclosures, cracks are formed in the magnetic particle layer to solve the above problem. However, formation of cracks entails another problem. Stiffness of the tape in the longitudinal direction of the tape becomes smaller than that in the direction of width thereof. When the magnetic recording tape is driven, the tape slidably driven past the magnetic head is not brought into contact with the magnetic head over its entire width. Thus, spacing loss is increased. Further, since stress concentrates especially in the cracks, resistance to oblique tearing of the magnetic recording tape may be considerably decreased. In other words, the tape tends to be torn obliquely.

SUMMARY OF THE INVENTION

The present invention has been made in consideration of the above problem and has for a first object to provide a process for forming a thin film layer without degrading physical strength of a base film and without thermal strain such as a wrinkle and a curl.

In order to achieve the above object of the present invention, there is provided a process for forming a thin film wherein predetermined tension is applied to a base film while the thin film is being formed thereon, and heat treatment of a thin film sheet is performed while the stress is being applied. In this heat treatment, the physical strength of the film is not degraded and the wrinkles and the curls are eliminated from the fabricated thin film sheet.

It is a second object of the present invention to provide a heat treatment process for completely eliminating wrinkles and curls from a sheet with a thin film.

In order to achieve the above object of the present invention, there is provided a heat treatment process comprising the steps of heating with a predetermined temperature rise gradient a sheet to which constant tension is applied and which includes a thin film until heat shrinkage occurs, and cooling the heat shrunk sheet, to which the constant tension is applied, with a temperature drop gradient corresponding to the temperature rise gradient. When this heat treatment is performed, the wrinkles and curls which are formed on the sheet when the thin film is formed are completely eliminated over the entire surface.

It is a third object of the present invention to provide a heat treatment apparatus for completely eliminating thermal strain such as wrinkles and curls from the sheet including the thin film.

In order to achieve the above objects of the present invention, there is provided a heat treatment apparatus comprising means for driving or traveling a sheet which includes a thin film and to which constant tension is applied, means for heat-insulating to keep the sheet at a temperature immediately below a non-reacting temperature at which heat shrinkage occurs, and means for heating the sheet traveled at the non-reacting temperature to a temperature at which heat shrinkage of the sheet occurs.

According to the heat treatment apparatus with the above structure, a heat shrinking reaction of the thin film sheet is carried out in a thermostat at a fixed temperature slightly lower than the temperature of heat shrinkage. Therefore, as compared with the case where the sheet is heat-treated by a conventional heating apparatus under room temperature, variation of temperature during the heat treatment process becomes far smaller.

Accordingly, the temperature of heat shrinkage of the sheet can properly and easily be controlled. Further, since proper tension is applied to the sheet, the sheet may not be curled in the opposite direction due to heat shrinkage, thus providing a flat sheet.

BRIEF DESCRIPTION OF THE DRAWINGS

FIGS. 1A and 1B are cross-sectional views of a curled thin film sheet and a corrugated thin film sheet, respectively;

FIG. 2 is a schematic view of the overall structure of a vapor deposition apparatus according to the present invention for forming a thin film and for performing heat treatment;

FIG. 3 is a perspective view of a mechanism for performing heat treatment of a thin film sheet which consists of a base film and a thin film formed thereon;

FIG. 4 is a perspective view showing a sheet roll of the base film with the thin film formed thereon;

DETAILED DESCRIPTION OF THE PREFERRED EMBODIMENT

Figure 5:
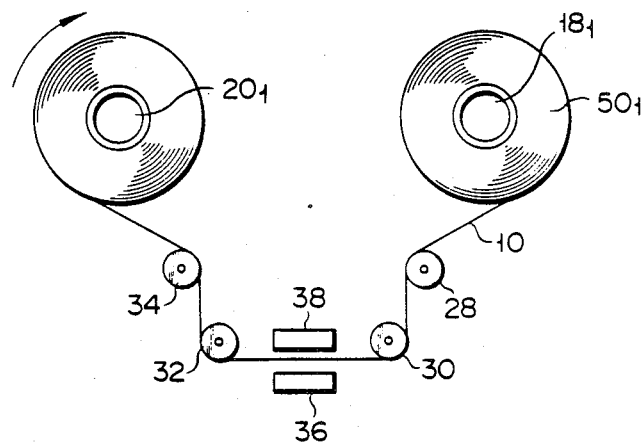
FIG. 5 is a view of a mechanism for afresh performing heat treatment of the base film with the thin film formed thereon.

An embodiment of the present invention will be described with reference to the accompanying drawings. The same or similar reference numerals denote the same or similar parts throughout the drawings, and a duplicated description thereof will be omitted.

FIG. 2 shows a reel winding-up type vapor deposition apparatus. A supply reel 18 and a take-up reel 20 are disposed inside a housing 16 which is coupled to a vacuum pump 14. A base film 10 wound around the supply reel 18 is supplied to the take-up reel 20 through a tension controller 22, a guide roller 24, a cooling can 26 and guide rollers 28 to 34. A pair of heaters 36 and 38 are disposed between the guide roller 30 and the guide roller 32 so as to put the base film 10 therebetween.

The base film 10 is driven or traveled by a servo motor (not shown) coupled to a rotating shaft of the take-up reel 20. The driving speed of the base film 10 is controlled to be constant by the servo motor. Tension applied to the base film 10 is preferably kept constant. For this purpose, a back tension applying mechanism such as a tension controller 22 is disposed on the side of the supply reel 18. A belt slipping mechanism may be used for such a mechanism. Alternatively, tension servo mechanisms may respectively be disposed on the both sides of the supply reel 18 and the take-up reel 20. Such a tension servo mechanism is disclosed in Japanese Patent Applications Nos. 55-92482 titled "Tension Servo Apparatus" and 55-115385 titled "Tension Servo Apparatus" both filed by the present applicant (OLYMPUS OPTICAL, CO.). These tension servo apparatuses may be utilized in this case. The disclosure of the above Japanese applications is now combined herewith.

A vapor source 40 is disposed directly under the cooling can 26. An evaporant 42 comprising a magnetic material (particles) of, e.g., Ni (nickel), Co (cobalt), Fe (iron) or garnet type magnetic particles is set in the vapor source 40. The evaporant 42 may be heated and evaporated by resistive heating, RF induction heating, or electron beam heating. Vaporized atoms (or molecules) $42_1$ are deposited on a surface portion of the base film 10 which is not masked by a screen 44, while the base film 10 is driven being in contact with the outer circumferential surface of the cooling can 26. These atoms $42_1$ are then cooled and recrystalized. By this recrystalization of the vaporized atoms $42_1$, internal stress occurs in the film 10, resulting in thermal strain such as wrinkles and curls in the film 10. This internal stress may substantially be eliminated when the same tension as in formation of the thin film layer 12 on the film 10 is applied to the film 10 during heat treatment. Thus, a thin film sheet which is formed of the base film 10 and a thin film layer 12 thereon is treated with heat.

This thin film sheet which consists of the base film 10 and the thin film layer 12 thereon is heated by the heaters 36 and 38. The thin film sheet (10+12) is heated under the same tension when the vaporized atoms $42_1$ are deposited on the surface of the base film 10. In the structure of FIG. 2, the cooling can 26 and the rollers 28 to 34 are rotated smoothly. With the above structure, tension applied to the base film 10 on the cooling can 26 is substantially the same as that applied to the base film 10 between the heaters 36 and 38. In this condition, the base film 10 with the thin film layer 12 thereon is heated by the heaters 36 and 38 to an extent that heat shrinkage occurs. If heating is sufficiently performed, mechanical strength of the base film 10 is not degraded and the internal stress is effectively eliminated.

The optimal temperature of heat treatment by the heaters 36 and 38 may vary in various conditions. A certain temperature cannot be specified. The temperature of heat treatment with the heaters 36 and 38 may be changed in accordance with the kinds of base film 10 and the evaporant 42, the thickness of the base film 10 and a thin film 12 formed thereon, the running speed of the film 10 and so on. The actual conditions of heat treatment may be determined by a cut-and-try operation in the process of fabricating the thin film magnetic tape. For instance, the base film 10 is subjected to heat shrinkage in accordance with the degree of shrinkage of the thin film which occurs in thin film forming process. Where the wrinkles and curls are eliminated without degrading the mechanical strength of the base film 10 at a certain temperature, then this temperature is defined as the optimal temperature of heat treatment. If the tension applied to the base film 10 is too weak, the wrinkles and curls cannot be eliminated. On the other hand, if the tension is too strong, the base film 10 is elongated. Therefore, when tension applied to the thin film sheet during heat treatment is substantially the same as that applied during formation of the thin film layer 12 on the base film 10, no trouble will occur. However, the film tension at the time of thin film formation need not strictly be the same as the sheet tension during heat treatment.

FIG. 3 shows a mechanism for treating with heat the thin film sheet which consists of the base film 10 and the thin film layer 12. The heaters 36 and 38 are made of nichrome wires and/or heating elements such as infrared ray lamps. Further, the heaters 36 and 38 preferably have a temperature sensor such as a thermistor, respectively. The heating elements and the temperature sensors are connected to a heater power source (not shown). Further, if power supply to the heating element is controlled with NFB operation, the film 10 can be heated at a constant temperature. Instead of the above automatic temperature control, a bimetal may be used to control the temperature.

FIG. 4 shows a film roll 50 (or thin film sheet roll) of the thin film sheet consisting of the base film 10 and the thin film layer 12. According to the apparatus of FIG. 2, the film 10 is driven to the side of the take-up reel 20 with constant tension and wound around a hub 52. The trailing end of the film roll 50 is fixed with an end seal 54. Substantially the same tension as applied to the base film 10 in the process for forming the thin film layer 12 on the base film 10 is applied to the rolled film along the longitudinal direction thereof. Therefore, the thin film sheet need not be treated with heat before the thin film sheet is rolled. Instead, the rolled sheet may be treated with heat in order to obtain the same effect. Thus, the wrinkles and curls can be eliminated. In this case, the film roll 50 is housed in a conventional thermostat and treated with heat. With the conventional thin film forming apparatus, the present invention may provide measures to solve the conventional problem.

FIG. 5 shows a case wherein the thin film sheet which consists of the base film 10 and the thin film layer 12 is afresh treated with heat. A thin film sheet roll $50_1$ is set on a supply reel $18_1$. The base film 10 supplied from the thin film sheet roll $50_1$ is wound by a take-up reel $20_1$ through the guide rollers 28 to 34. At this time, tension of the thin film sheet is automatically controlled to be equal to tension applied on the film 10 when the thin film layer 12 is formed thereon. With such constant tension, the thin film sheet is heated by the heaters 36 and 38. With this arrangement, the wrinkles and curls can also be eliminated.

Figure 6:
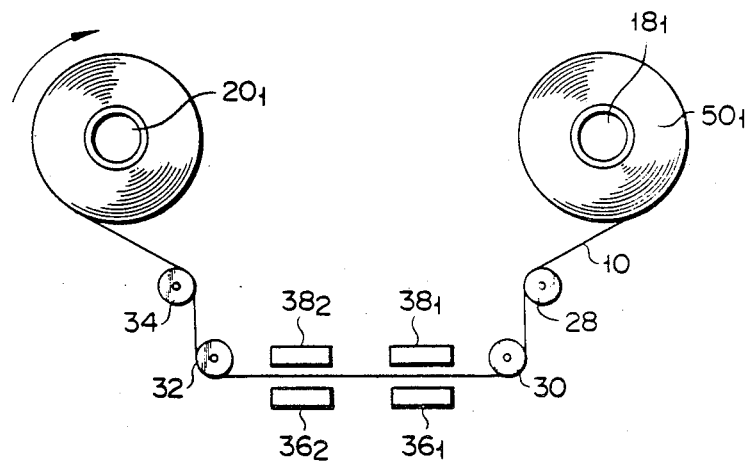
FIG. 6 is a view of a modification of the mechanism of FIG. 5.

FIG. 6 shows a modification of the mechanism of FIG. 5. The thin film sheet is preheated by a first pair of heaters $36_1$ and $38_1$ and the sheet is shrunk with heat by a second pair of heaters $36_2$ and $38_2$. With the above structure, the thin film sheet is uniformly treated with heat over the entire width of the thin film sheet.

As described above, according to the present invention, the tension applied during heat treatment to the film is equal to that applied during the process for forming the thin film layer 12 on the base film 10. Further, the base film is properly shrunk with heat in accordance with heat shrinkage of the thin film. Therefore, if the proper heat treatment is performed according to the process of the present invention, the mechanical strength of the base film is not degraded and the wrinkles and curls can be eliminated. Therefore, a magnetic recording tape fabricated according to the process of the present invention properly comes into contact with the magnetic head. Further, dropouts and output level variations are minimized.

Experimental results of a heat treatment process according to the present invention will be described below.

A polyester film of 10 $\mu$m was used as the base film 10. A thin film of Al-Co (aluminum-cobalt) was deposited on the base film 10 to a thickness of 0.3 to 0.5 $\mu$m. The results obtained are as shown in Table 1.

TABLE 1

| Heat Treatment Temp. (°C.) | Time (min.) | State of Base Film |
|---|---|---|
| 80 | 15 | No heat shrinkage (curled) |
| 84 | 2 | Weak curl toward the thin film 12 side |
| 84 | 3 | Flat (curl removed) |
| 84 | 5 | Weak curl toward the base film 10 side (opposite curl) |
| 90 | 0.5 | Weak curl toward the thin film 12 side |
| 90 | 1 | Flat (curl removed) |
| 90 | 2 | Weak curl toward the base film 10 side (opposite curl) |

From the experimental results as shown above, the following analysis may be made. Since thermal shrinkage does not occur at a temperature of 80° C. or lower, the curl cannot be removed from the base film at such nonreactive temperature (80° C.). On the other hand, when the thin film sheet is treated with heat at a temperature of 84° C. for 3 minutes or 90° C. for one minute, the curl can be removed. However, when the temperature of heat treatment is increased to 98° C. or higher, the thin film sheet is spontaneously curled toward the base film 10 side and a number of wrinkles are formed thereon. Since the heat treatment operation is so delicate as mentioned above, the temperature range in heat treatment for removing wrinkles from the base film must be properly determined. In order to uniformly perform heat shrinkage of the base film with heat as well as to prevent excessive heat shrinkage due to an abnormally high temperature, heating and cooling must be performed slowly to prevent excessive heat shrinkage. Such slow cooling of the thin film sheet may be spontaneously performed in a closed thermostat whose power supply is cut-off. If the film is heated with substantially the same temperature gradient as applied to cooling, the film is not heated to an abnormally high temperature as described above.

Figure 7:
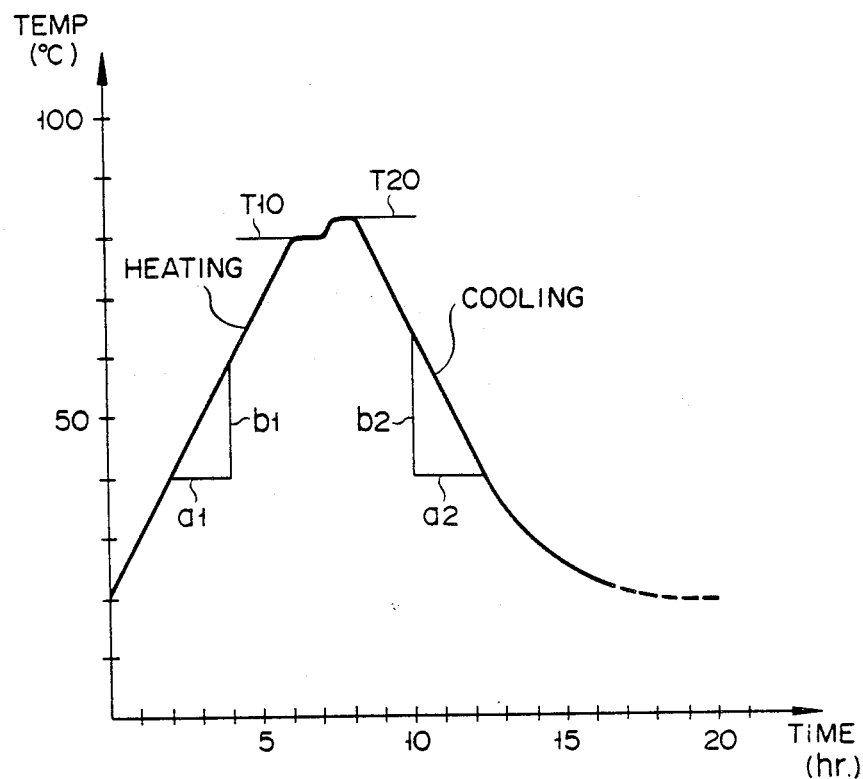
FIG. 7 is a graph showing temperature changes in the process of heat treatment as a function of time.

FIG. 7 is a graph showing temperature changes in heat treatment as a function of time. The film roll 50 wound with constant tension is placed in a conventional thermostat (not shown). The temperature in the constant temperature bath is increased with a predetermined gradient. This temperature gradient is given by b1/a1. The temperature of the thermostat is kept at a nonreactive temperature T10 immediately before heat shrinkage occurs. Where the temperature T10 is established and this temperature is temporarily maintained, then the temperature distribution in the film roll 50 is made uniform. Further, differences between the temperature before heat shrinkage and the temperature after heat shinkage become smaller. Therefore, the film roll 50 is treated with heat under excellent conditions. When the film roll 50 is entirely maintained at substantially the constant temperature, the temperature of the thermostat is then increased to a temperature T20 at which heat shrinkage occurs gradually. With this heat treatment, thermal strain is eliminated, and the thermostat is then cooled to room temperature gradually.

Assume that the cooling rate of the thermostat, that is, the temperature drop gradient is defined as b2/a2. The preferred temperature rise gradient b1/a1 is then determined as:

$$|b1/a1| \simeq |b2/a2|$$

The heating rate is selected to be substantially equal to the cooling rate. Thus, curls can be removed from the film roll 50 smoothly. Further, wrinkles may not be formed.

The optimal conditions of heat treatment may vary in accordance with various factors. Therefore, the fixed optimal conditions cannot be determined for all cases. The temperature gradients b1/a1 and b2/a2 and temperatures T10 and T20 in heat treatment are changed in accordance with the type of base film 10, the kind of evaporant 42, thicknesses of the base film 10 and the thin film layer 12 formed thereon, as needed. Therefore, the actual optimal conditions may be determined by a cut-and-try operation in the process of fabricating the thin film tape. In particular, the base film 10 is shrunk with heat in accordance with the rate of heat shrinkage of the thin film in the process for forming the thin film. If wrinkles and curls are completely eliminated under certain conditions, these conditions are defined as optimal conditions.

As described above, according to the present invention, the base film is uniformly shrunk with heat in accordance with heat shrinkage of the thin film, so that the mechanical strength of the base film is not degraded and the wrinkles and curls of the film are effectively removed. Therefore, the magnetic recording tape fabricated according to the process of the present invention travels smoothly and comes in contact with the magnetic head properly. Further, dropouts and output level variations are decreased.

Figure 8:
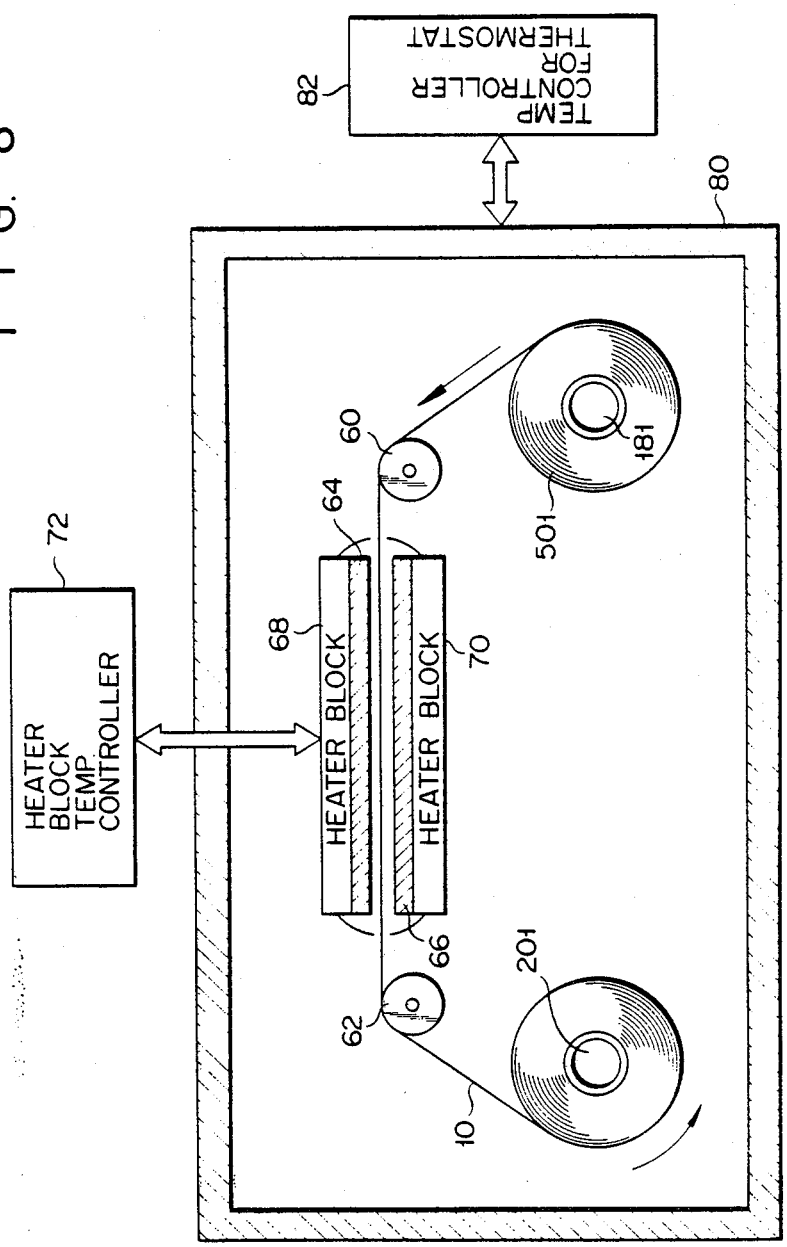
FIG. 8 is a view of the overall structure of a heat treatment apparatus according to one embodiment of the present invention.

FIG. 8 shows a heat treatment apparatus according to one embodiment of the present invention. The film roll $50_1$ of the thin film sheet is set on the supply reel $18_1$. The thin film sheet rolled as the film roll $50_1$ is supplied to the take-up reel $20_1$ through guide rollers 60 and 62. The film sheet is driven at a constant speed and with constant tension. Heating plates 64 and 66 are disposed between the rollers 60 and 62. Heater blocks 68 and 70 are mounted on the heating plates 64 and 66, respectively. The heating plates 64 and 66 oppose each other and are spaced apart from each other. The fim sheet 10 travels between the heating plates 64 and 66. The heater blocks 68 and 70 are not illustrated in detail. However, they include a heat sensor such as a thermistor. The heater blocks 68 and 70 are connected to a heater block temperature controller 72. The supply reel $18_1$, the take-up reel 20, the film roll $50_1$, the guide rollers 60 and 62, the heating plates 64 and 66, and the heater blocks 68 and 70 are housed or enclosed in a thermostat 80. The internal temperature of the thermostat 80 is controlled by a temperature controller 82 for the thermostat.

Figure 9:
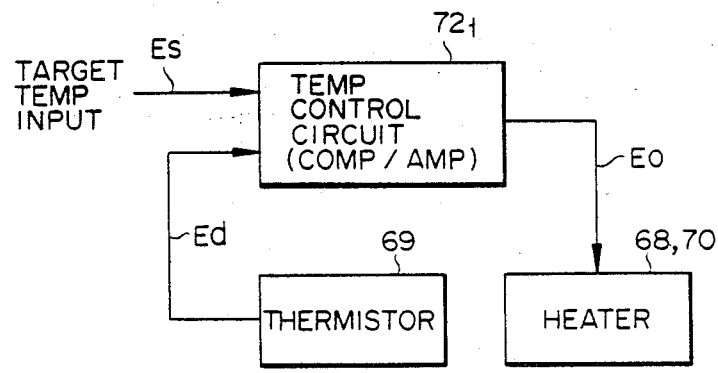
FIG. 9 is a block diagram of the heater block temperature controller of the heat treatment apparatus of FIG. 8.

FIG. 9 shows a schematic diagram of the structure of the heater block temperature controller 72 of FIG. 8. Assume here that the film 10 is shrunk with heat at a temperature of 100° C., an input signal Es corresponding to the temperature of 100° C. is supplied to a temperature control circuit $72_1$. The temperature control circuit $72_1$ supplies the heaters 68 and 70 with power E0 corresponding to the level of the input signal Es. The temperature control circuit $72_1$ includes a comparator and a power amplifier. The heaters 68 and 70 are heated in accordance with the power E0. Heat generated from the heaters 68 and 70 is detected by a thermistor 69. The thermistor 69 feeds back to the temperature control circuit $72_1$ a temperature signal Ed corresponding to the temperature of heat generated from the heaters 68 and 70. The temperature control circuit $72_1$ compares the input signal Es and the temperature signal Ed and determines the level of power E0. Thus, the temperature of heat generated from the heaters 68 and 70 is kept at 100° C.

Referring to FIG. 8, the supply reel $18_1$, the take-up reel $20_1$, a drive source such as a servo motor (not shown) coupled thereto, and the guide rollers 60 and 62 constitute film driving means for driving the film with constant tension. Further, the heating plates 64 and 66, the heater blocks 68 and 70, and the heater block temperature controller 72 constitute heating means for heating the sheet to a temperature at which heat shrinkage of the film 10 occurs. The thermostat 80 and the temperature controller 82 for the thermostat constitute heating means for heating the film sheet 10 at a temperature immediately before thermal shrinkage of the film 10 occurs. The film sheet 10 is preheated to a nonreactive temperature before it is heated by the heating plates 64 and 66. This nonreactive temperature is determined in advance in accordance with the type of the film 10 or other related factors. The preheated sheet 10 passes through between the heating plates 64 and 66 at a constant speed and with constant tension. The film 10 is shrunk with heat properly while it passes between the heating plates 64 and 66. When heat shrinkage of the film 10 is performed properly, thermal strain such as wrinkles and curls is completely eliminated from the thin film sheet.

Heat shrinkage as described above is performed in the thermostat whose internal temperature is slightly lower than the temperature of heat shrinkage. Therefore, the temperature of the heating plates 64 and 66 does not greatly differ from the ambient temperature in the thermostat. Accordingly, the temperature of the heater blocks 68 and 70 is controlled easily. A necessary time period from the time in which power is supplied to the heater blocks 68 and 70 to the time in which they reach a predetermined temperature is thus shortened. Further, the temperature of the sheet may not change greatly before and after it passes between the heating plates 64 and 66. Accordingly, heat shrinkage of the film 10 is performed smoothly. Further, since the film 10 is shrunk with heat under fixed tension, the thin film sheet may not be curled toward the base film, thus fabricating a flat thin film sheet.

If the tension applied to the thin film sheet is too weak, the wrinkles and curls cannot completely be eliminated. On the other hand, if the tension applied to the thin film sheet is too strong, the thin film sheet is elongated. The tension applied to the thin film sheet during heat treatment is therefore selected to be substantially equal to the tension applied during manufacture of the thin film 12 on the base film 10. However, the tension applied to the thin film sheet during heat treatment may not be equal to the tension applied to the base film 10 during formation of the thin film 12.

Figure 10:
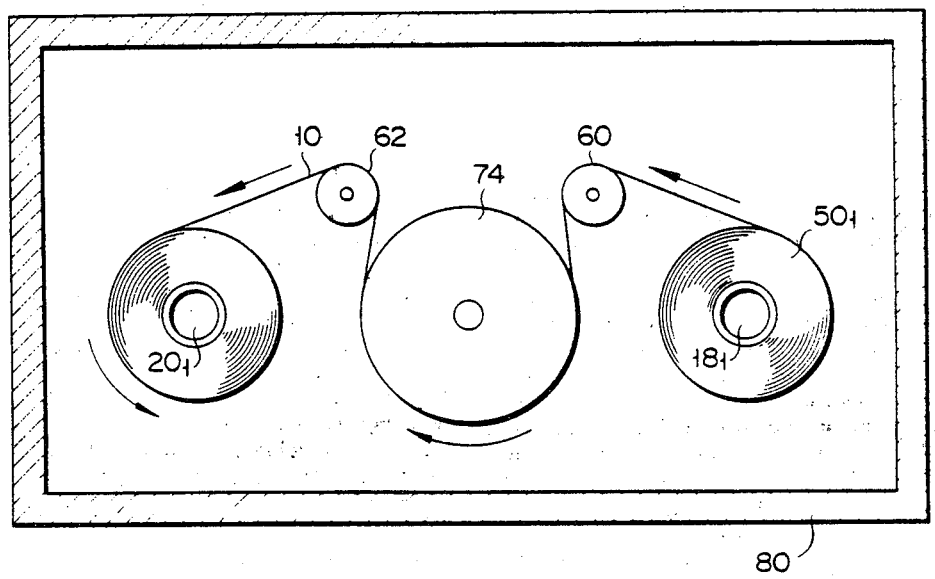
FIG. 10 is a view of a modification of the heat treatment apparatus of FIG. 8.

FIG. 10 shows a modification of the heat treatment apparatus of FIG. 8. In the heat treatment apparatus of FIG. 8, a pair of heaters which put the film therebetween to heat it is used. On the other hand, in the heat treatment apparatus as shown in FIG. 10, a heat roller 74 which smoothly rotates and is brought into contact with the sheet 10 is utilized. The sheet is, in turn, driven contacting with the circumference of the heat roller 74. The heat roller 74 includes a heater which is controlled in cooperation with a heat sensor as shown in FIG. 9. The surface temperature of the heat roller 74 is kept at a predetermined temperature at which shrinkage occurs. With the heat treatment apparatus having the above structure, the present inventor conducted an experiment under the following conditions:

Base film 10: a polyester film of 6 μm thickness
Thin film 12: an Ni-Co alloy which is deposited on the film 10 to a thickness of about 0.3 μm
Heat roller 74: 200 mm in diameter
Film driving speed: 14 m/min.
Film tension: 2.5 kg/mm² (same as in deposition of the Ni-Co thin film)
Internal Temperature of the thermostat 80: 95° C.
Temperature of the heat roller 74: 100° C.

As a result, a thin film sheet without wrinkles and curls in its entire width was obtained.

The present invention is not limited to the above particular embodiment. Various changes and modifications may be made within the scope of the appended claims. For example, referring to FIG. 3, the amount of heat of the heater 36 may be less than that of the heater 38. Thus, a temperature gradient may be formed along the direction of thickness of the base film or the thin film sheet 10. The thin film forming apparatus disclosed in Japanese Patent Application No. 55-176578 filed by the same applicant as in the present application may be utilized as needed. With the apparatus disclosed in the above patent application, side tension may be applied to the sheet which is treated with heat. The disclosure of this patent application is also combined herewith. Further, the thin film 12 is not restricted to a magnetic thin film. The present invention may be applied to fabrication of multilayered tape which has two or more thin films 12.

Referring to FIG. 8, the temperature of the heating plate 64 may slightly differ from that of the heating plate 66. An infrared ray lamp may be used as a heater. Further, a plurality of heat rollers 74 as shown in FIG. 10 may be used to heat the film roll at different temperatures.

What is claimed is:

1. A process for forming a thin film layer containing a magnetic material comprising magnetic particles on a surface of a band-shaped base film having a given width and a given thickness, said band-shaped base film consisting essentially of a heat-shrinkable plastic, said process comprising:
   (a) applying a given tension in the longitudinal direction to the band-shaped base film;
   (b) depositing the thin film layer on the surface of said band-shaped base film under said given tension by means of vacuum deposition, sputtering, electron beam deposition or ion-plating to thereby form a thin film sheet;
   (c) applying a fixed tension to said thin film sheet in the longitudinal direction of the band-shaped base film;
   (d) heating said thin film sheet under said fixed tension at a temperature at which heat shrinkage of said thin film layer and said band-shaped base film of said thin film sheet occurs.

2. The process of claim 1, wherein said heat shrinkable plastic is a polyester.

3. The process of claim 1, wherein said base film is treated with heat by heaters which face each other and are spaced apart from both sides of said base film.

4. A thin film magnetic tape obtained by cutting said thin film sheet prepared by the process according to claim 1.

5. A process for forming a thin film layer containing a magnetic material containing nickel, cobalt, iron or magnetic garnet on a surface of a band-shaped base film consisting essentially of a heat-shrinkable plastic comprising:
   (a) applying a predetermined tension to the band-shaped base film in the longitudinal direction thereof;
   (b) depositing the thin film layer on the surface of said band-shaped base film under said predetermined tension by means of vacuum deposition, sputtering, electron beam deposition or ion-plating to thereby form a thin film sheet;
   (c) rolling up said thin film sheet under a given tension applied to said band-shaped base film in the longitudinal direction thereof; and
   (d) heating the roll of said thin film sheet containing said band-shaped base film.

6. The process of claim 5, wherein said heat shrinkable plastic is a polyester.

7. The process of claim 5, wherein said roll is heated in a thermostat.

8. The process of claim 5, wherein the band-shaped base film of said thin film sheet is shrunk during said heating step at a temperature corresponding to the temperature at which heat shrinkage of said thin film layer occurs.

9. The process of claim 6, wherein the band-shaped base film of said thin film sheet is shrunk during said heating step at a temperature corresponding to the temperature at which heat shrinkage of said thin film layer occurs.

10. The process of claim 7, wherein the band-shaped base film of said thin film sheet is shrunk during said heating step at a temperature corresponding to the temperature at which heat shrinkage of said thin film layer occurs.

11. A thin film magnetic tape obtained by cutting said roll prepared in the process according to claim 8.

* * * * *

UNITED STATES PATENT AND TRADEMARK OFFICE
CERTIFICATE OF CORRECTION

PATENT NO. : 4,489,124
DATED : December 18, 1984
INVENTOR(S) : Seizo WATANABE

It is certified that error appears in the above-identified patent and that said Letters Patent is hereby corrected as shown below:

On the title page of the patent, in the right column, after the data setting forth the inventor's name and address, insert the identification of the Assignee as follows:

--Olympus Optical Co., Ltd.,
Tokyo, Japan.--.

Signed and Sealed this

Twenty-first Day of January 1986

[SEAL]

Attest:

DONALD J. QUIGG

Attesting Officer     Commissioner of Patents and Trademarks